(12) United States Patent
Jaklitsch

(10) Patent No.: US 7,443,337 B2
(45) Date of Patent: Oct. 28, 2008

(54) SYNTHESIZING ARBITRARY WAVEFORMS USING CONVOLUTION PROCESSORS

(75) Inventor: James J. Jaklitsch, Parkton, MD (US)

(73) Assignee: AAI Corporation, Hunt Valley, MD (US)

( * ) Notice: Subject to any disclaimer, the term of this patent is extended or adjusted under 35 U.S.C. 154(b) by 0 days.

(21) Appl. No.: 11/859,038

(22) Filed: Sep. 21, 2007

(65) Prior Publication Data

US 2008/0074155 A1 Mar. 27, 2008

Related U.S. Application Data

(60) Provisional application No. 60/846,764, filed on Sep. 25, 2006.

(51) Int. Cl.
*G01S 7/02* (2006.01)
*H03B 21/02* (2006.01)

(52) U.S. Cl. .................. 342/195; 342/169; 327/105

(58) Field of Classification Search ................ 342/169, 342/194, 195; 327/105
See application file for complete search history.

(56) References Cited

U.S. PATENT DOCUMENTS 4,673,941 A * 6/1987 Van Der Mark ............. 342/195
6,150,976 A 11/2000 Cooley

* cited by examiner

*Primary Examiner*—Ian J Lobo
(74) *Attorney, Agent, or Firm*—Venable LLP; Cameron H. Tousi

(57) ABSTRACT

A method for generating a synthesized waveform from a desired arbitrary waveform via a convolution processor includes: providing a data stream input signal to the convolution processor including an extended duration impulse signal; computing one or more filter coefficients of the convolution processor; and generating the synthesized waveform substantially similar to the desired arbitrary waveform using the filter coefficients. The convolution processor may be a finite impulse response (FIR) filter. The convolution processor may perform a convolution upon the extended duration impulse signal, where: the extended duration impulse signal is successively delayed via one or more taps and the output of each tap is multiplied by a filter coefficient corresponding to a delay; and the summation of the products of tap outputs and filter coefficients is the desired arbitrary waveform.

23 Claims, 13 Drawing Sheets

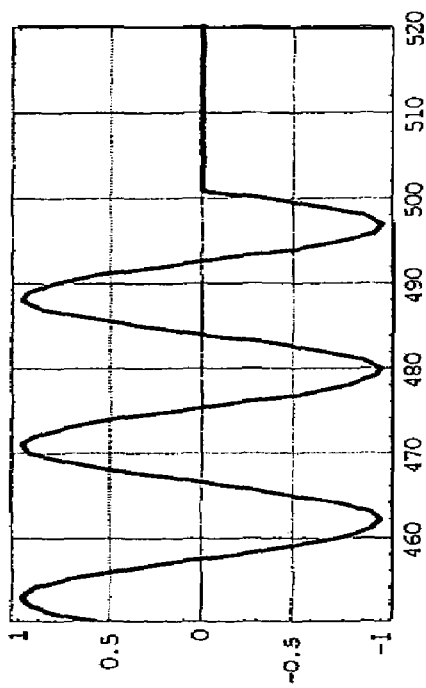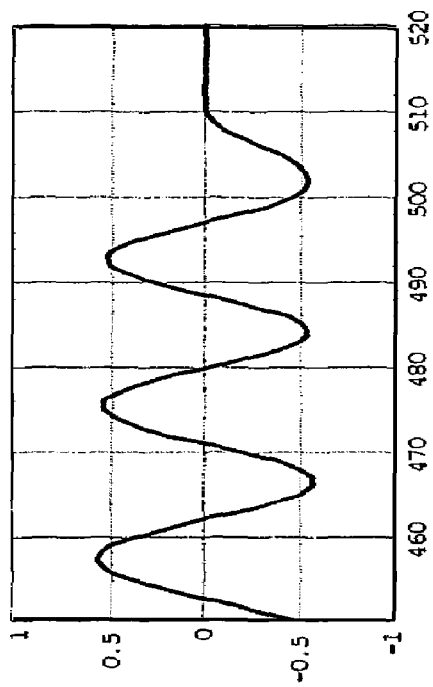

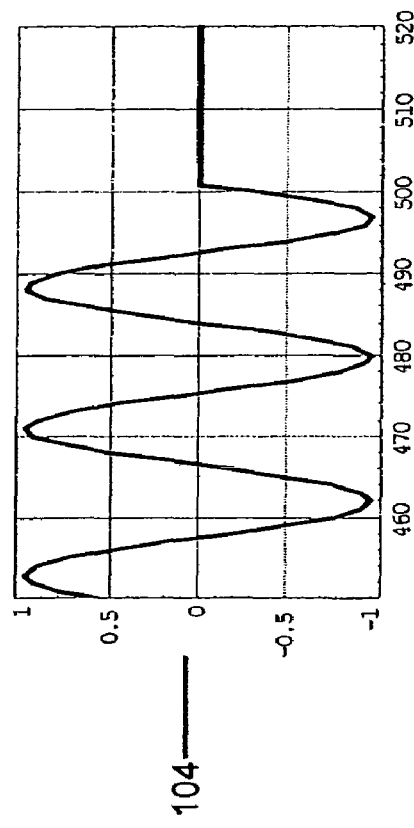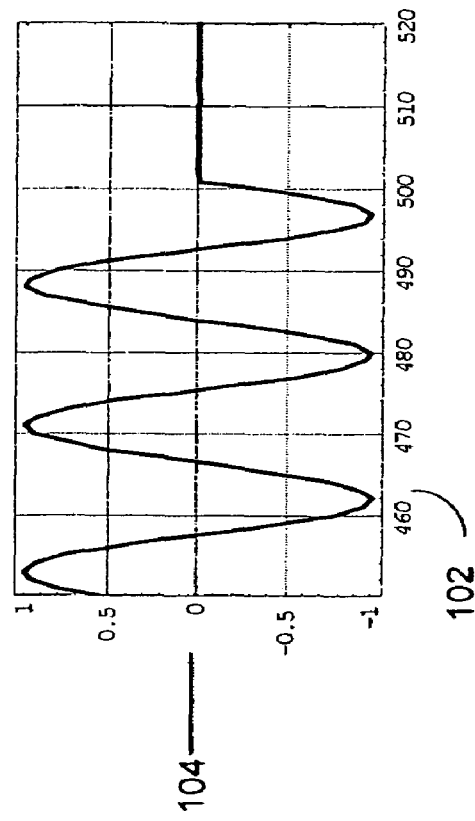

$[W_1 \ W_2 \ W_3 \ W_4 \ W_5 \ \ldots \ W_i\ ]$ ─ 1200

FIG. 12

$[C_1 \ C_2 \ C_3 \ C_4 \ C_5 \ \ldots \ C_j\ ]$ ─ 1300

FIG. 13

SYNTHESIZING ARBITRARY WAVEFORMS USING CONVOLUTION PROCESSORS

FIELD OF THE INVENTION

The present invention relates generally to communications and, more particularly, to waveform synthesis.

RELATED ART

Modern radar and sonar technology typically use pulse compression technology, a signal processing technique that modulates a transmitted pulse, used for augmenting distance resolution and signal to noise ratio. A common pulse compression technique is chirp compression. In chirp compression, a chirp signal in which the frequency increases (called up-chirp) or decreases (called down-chirp') with time is provided.

An exemplary filtering technology used for pulse compression radars is surface acoustic waveform (SAW) filtering technology. A SAW is an acoustic wave that travels along the surface of a substrate having elasticity, whose amplitude decays exponentially with the depth of the substrate. SAW filters are typically electromechanical devices, where electrical signals are converted to a mechanical wave in a piezoelectric crystal. The wave may be delayed as it travels through the crystal, before being converted back to an electrical signal by additional electrodes, and the delayed outputs are recombined to produce a direct analog implementation of a finite impulse response filter. The SAW exciter/receiver least replaceable unit (LRU) generates expanded pulse waveforms for transmission, and compresses waveforms returned from the targets, permitting increase of the signal-to-noise ratio without impacting range resolution.

Because the returning waveforms from multiple discrete targets overlap in times, however, it is extremely difficult to produce testing and simulation. An exemplary radar environment simulator (RES) is a digital radar landmass simulator (DRLMS). The problem is one of simulating such a semi-infinite continuum of closely spaced targets represented by time-overlapping signals with a technique for simulating SAW expansion/compression waveforms. But duplicating the complex chirp waveform from a SAW filter is an extremely difficult task, as in response to an impulse stimulus, a SAW must generate a frequency modulated output that continuously slews in frequency, which may be upward or downward, linear or nonlinear, and may have a particular gain bandwidth.

In U.S. Pat. No. 6,150,976, entitled "Synthesis of Overlapping Chirp Waveforms," of common assignee hereof, James R. Cooley made great strides in solving this problem. In so doing, Cooley developed the concept of taking advantage of the architecture of low cost Finite Impulse Response (FIR) filter processing semiconductor chips to synthesize the overlapping chirp waveforms.

FIR filters are convolution processors. In normal operation, the filters operate by convolving an unfiltered digital data stream with a set of coefficients that represent the filter impulse response. The convolution of an input digital data stream with a specific impulse response produces a filtered data stream as output. There are a number of applications for FIR filters, with RES being one of them.

Cooley's method operates well for a single impulse input to the FIR filter. For application in RES, however, there are other system considerations that may require the impulse to have an extended duration, meaning that the stimulus needs to be multiple samples in length. In particular, the need to accurately simulate Doppler modulation drives a requirement that the "impulse" be extended over a number of sample periods. What is needed is a method and corresponding system to replicate a desired arbitrary waveform by stimulating a convolution processor, such as a FIR filter, with an "impulse" of more than single sample duration.

SUMMARY OF THE INVENTION

The present invention sets forth various exemplary embodiments of apparatuses, systems, methods and computer program products for providing automated telecommunications backup.

In an exemplary embodiment, a method and corresponding system and computer program product is provided for generating a synthesized waveform from a desired arbitrary waveform via a convolution processor. The method includes: providing a data stream input signal to the convolution processor comprising an extended duration impulse signal; computing one or more filter coefficients of the convolution processor; and generating the synthesized waveform substantially similar to the desired arbitrary waveform using the filter coefficients. In an exemplary embodiment, the convolution processor comprises a finite impulse response (FIR) filter.

In exemplary embodiments, the extended duration impulse signal comprises i impulse signals, where i is an integer. The convolution processor may perform a convolution upon the extended duration impulse signal, where: the extended duration impulse signal is successively delayed via one or more taps and the output of each of the taps is multiplied by the filter coefficient corresponding to its delay; and the summation of the products of tap outputs and filter coefficients is the desired arbitrary waveform.

In exemplary embodiments, the convolution processor comprises j of the taps and j of the filter coefficients, where j is an integer. The desired arbitrary waveform may be sampled j times. The j samples of the desired arbitrary waveform may be supplemented by i−1 samples equaling zero to generate an n×1 waveform data matrix (WFDM), where n=j+i−1.

In exemplary embodiments, the state of the convolution processor is determined as the extended duration impulse signal is transmitted to the convolution processor at successive increments of time. In an exemplary such embodiment, the state of the convolution processor is stored in a convolution state matrix (CSM) having n columns and j rows, each column representing a state of the convolution processor at a such increment of time, and each row representing a delay provided by the tap.

In yet another exemplary embodiment, the filter coefficients are derived from the waveform data matrix and the convolution state matrix. In one such exemplary embodiment, the filter coefficients are stored in a filter coefficient matrix (FCM) whose value equals: WFDM. Transpose [CSM]. Inverse[CSM. Transpose[CSM]].

The foregoing embodiments, together with embodiments directed to methods and computer program products thereof, are described in greater detail below.

BRIEF DESCRIPTION OF THE FIGURES

Various exemplary features and advantages of the invention will be apparent from the following, more particular description of exemplary embodiments of the present invention, as illustrated in the accompanying drawings wherein like reference numbers generally indicate identical, functionally similar, and/or structurally similar elements. The left

FIG. 3A illustrates an exemplary desired waveform in accordance with known embodiments; FIG. 3B illustrates an exemplary synthesized waveform in accordance with known embodiments;

FIG. 6A illustrates an exemplary desired waveform in accordance with present embodiments; FIG. 6B illustrates an exemplary synthesized waveform in accordance with present embodiments.

FIG. 12 illustrates an exemplary waveform data matrix derived from the desired arbitrary waveform of FIG. 11;

FIG. 13 illustrates the composition of an exemplary filter coefficient matrix in accordance with the present embodiments;

DETAILED DESCRIPTION OF VARIOUS EXEMPLARY EMBODIMENTS OF THE INVENTION

Overview of Exemplary Embodiments

A preferred exemplary embodiment of the invention is discussed in detail below. While specific exemplary embodiments are discussed, it should be understood that this is done for illustration purposes only. A person skilled in the relevant art will recognize that other components and configurations may be used without parting from the spirit and scope of the invention.

Exemplary Embodiments

Figure 1:
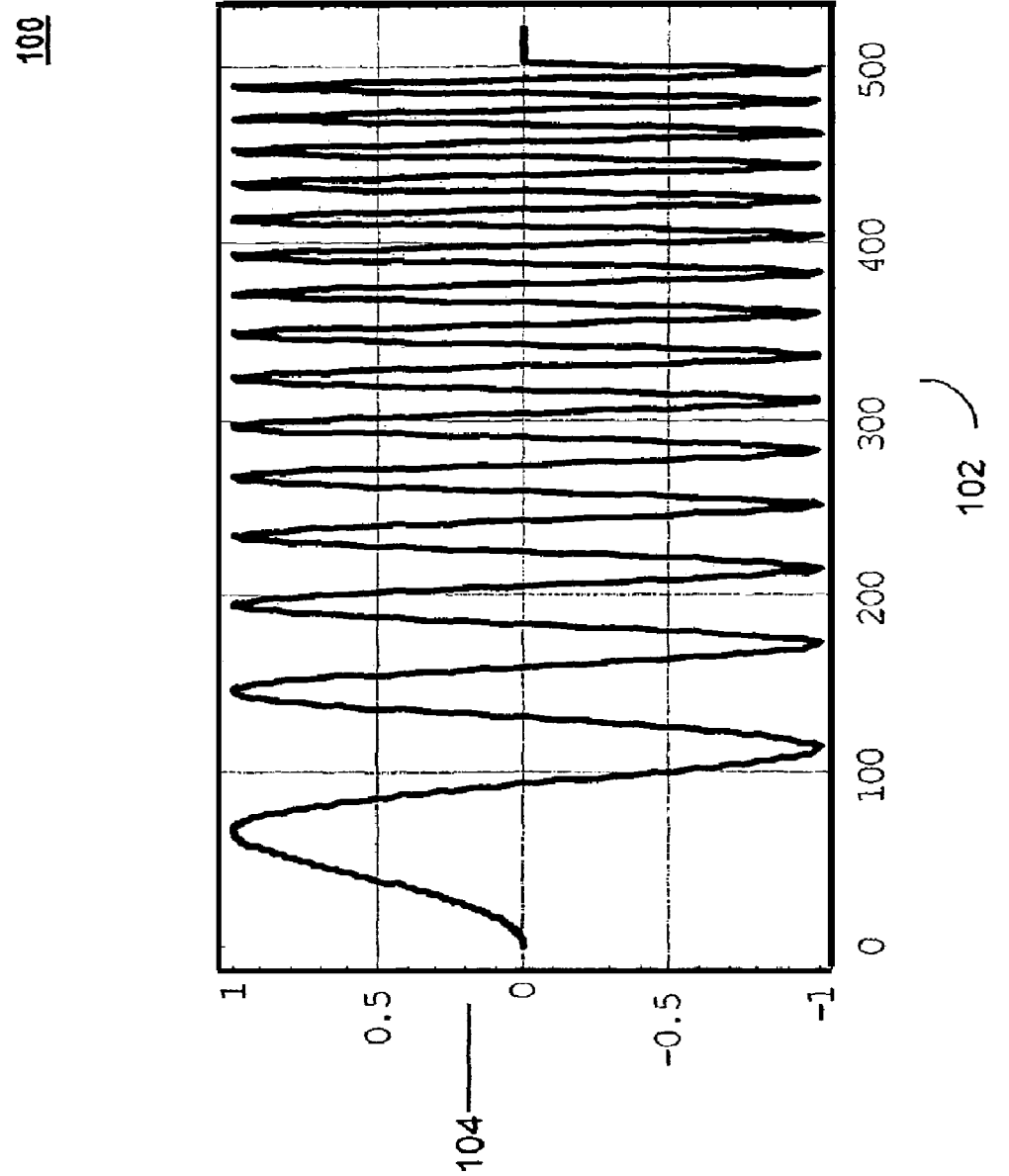
FIG. 1 illustrates an exemplary desired arbitrary waveform.

FIG. 1 illustrates an exemplary desired arbitrary waveform 100, with time 102 shown as abscissa and amplitude 104 shown as ordinate or function of time 102. In the illustrated embodiment, desired arbitrary waveform 100 is a linear frequency modulation (FM) chirp, and it is intentionally scaled to be short enough to be readily visible in graphical form. Actual radar waveforms may tend to be much longer, and the details may be difficult to view without high power zoom.

Using Cooley's method, set forth in U.S. Pat. No. 6,150,976, with a unit impulse of one period duration as input to a FIR filter, waveform 100 shown in FIG. 1 can be exactly replicated. The FIR waveform generation filter may be loaded with coefficients that are the digitized values of the waveform and, when stimulated with a unit impulse, will more or less exactly replicate the waveform. Multiple time-overlapping versions of waveform 100 of FIG. 1 may be synthesized more or less exactly by stimulating the FIR waveform generation filter with multiple unit impulses that are spaced in time in relation to one another.

Figure 2:
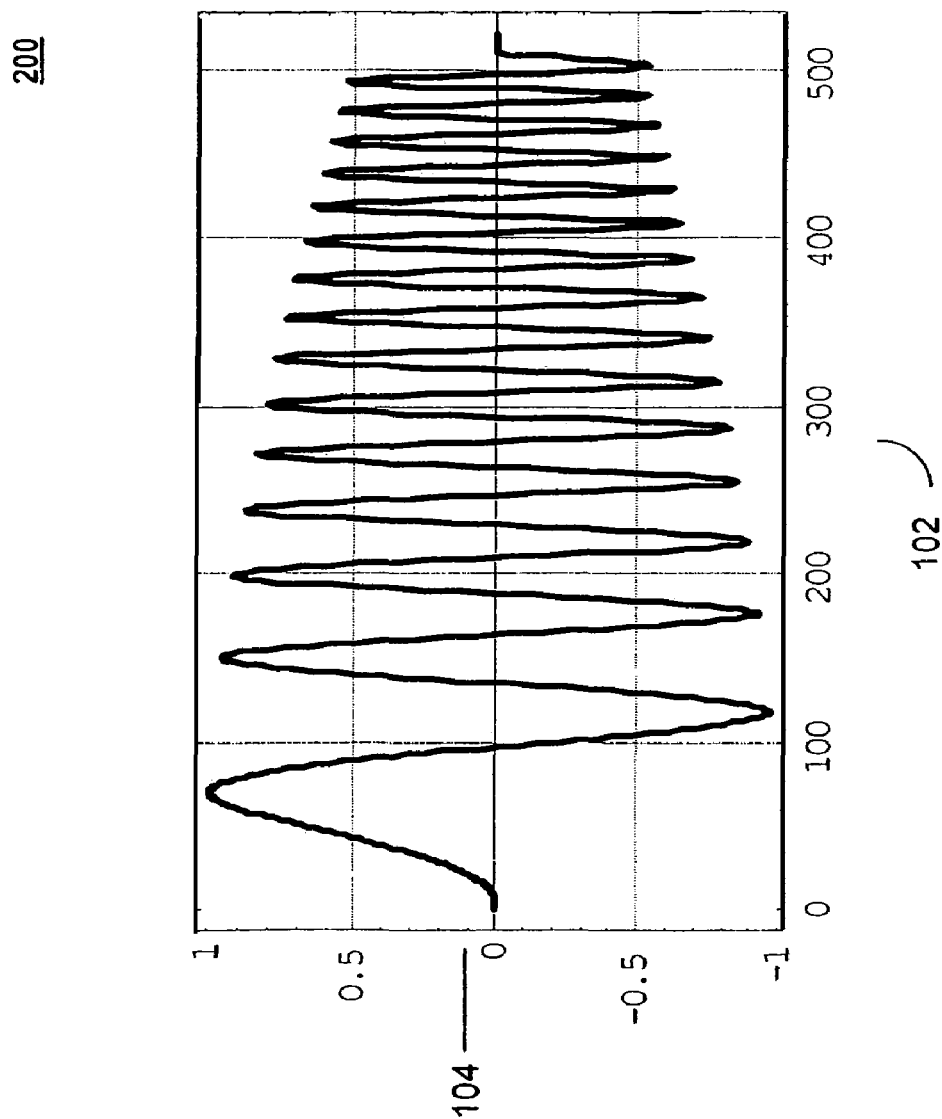
FIG. 2 illustrates an exemplary waveform synthesized from a finite impulse response filter when a unit impulse input to the filter is replaced with a constant signal multiple sample periods in length.

But when a unit impulse cannot be used, due to other system considerations, the accuracy of Cooley's method may break down. FIG. 2 illustrates an exemplary waveform 200 synthesized from the same or a similar FIR filter when the foregoing unit impulse input to the FIR filter is replaced with a constant signal that is multiple sample periods in length. Again, the time 102 is shown as abscissa and amplitude 104 is shown as ordinate. For ease of explanation, such a signal may be referred to as an "impulse" signal of multiple period duration. In the illustrated embodiment of FIG. 2, the exemplary synthesized waveform 200 results from an input "impulse" signal that is 10 sample-periods in duration. As shown, there is obvious amplitude distortion, caused by the extended duration of the "impulse."

Cooley's solution to the amplitude distortion is to weight the coefficients that comprise the filter impulse response, in an attempt to recover the amplitude roll-off seen in exemplary synthesized waveform 200. However, in certain embodiments this may be merely a partial solution, because there may also be distortion to phase and even to the pulse length, and neither of these latter parameters can be compensated by weighting the amplitude. Because the filter is performing a convolution, widening the impulse stretches the pulse width by the duration of the impulse. This effect can be viewed by comparing exemplary desired waveform 300 of FIG. 3A to exemplary synthesized waveform 310 of FIG. 3B. In the exemplary embodiment shown in FIG. 3B, the input to the FIR filter used in the synthesis process comprises a 10-sample "impulse." Referring to the exemplary desired waveform 300 of FIG. 3A, the width of the desired pulse is 500 sample periods. However, in the synthesized waveform 310 of FIG. 3B, the convolution process has stretched the synthesized pulse by the width of the impulse, having 10 samples in the illustrated example, such that the synthesized pulse is stretched to 510 samples.

In some applications, stretching the pulse by a few sample periods may not produce a significant error, and weighting the filter coefficients to compensate the amplitude distortion may provide an acceptable result. In other applications, however, the pulse width error may be considered significant, particularly since it brings with it an attendant phase error. A close examination of the phases between waveforms 100 and 200, of FIGS. 1 and 2, and between waveforms 300 and 310 of FIGS. 3A and 3B, shows a significant phase shift between the respective desired and synthesized pulses. Worse yet, the phase shift may not be constant across the length of the pulse. For example, as illustrated, the phase error is nearly zero at the beginning of the pulse, but has increased to approximately 90 degrees by the end pulse.

Figure 4:
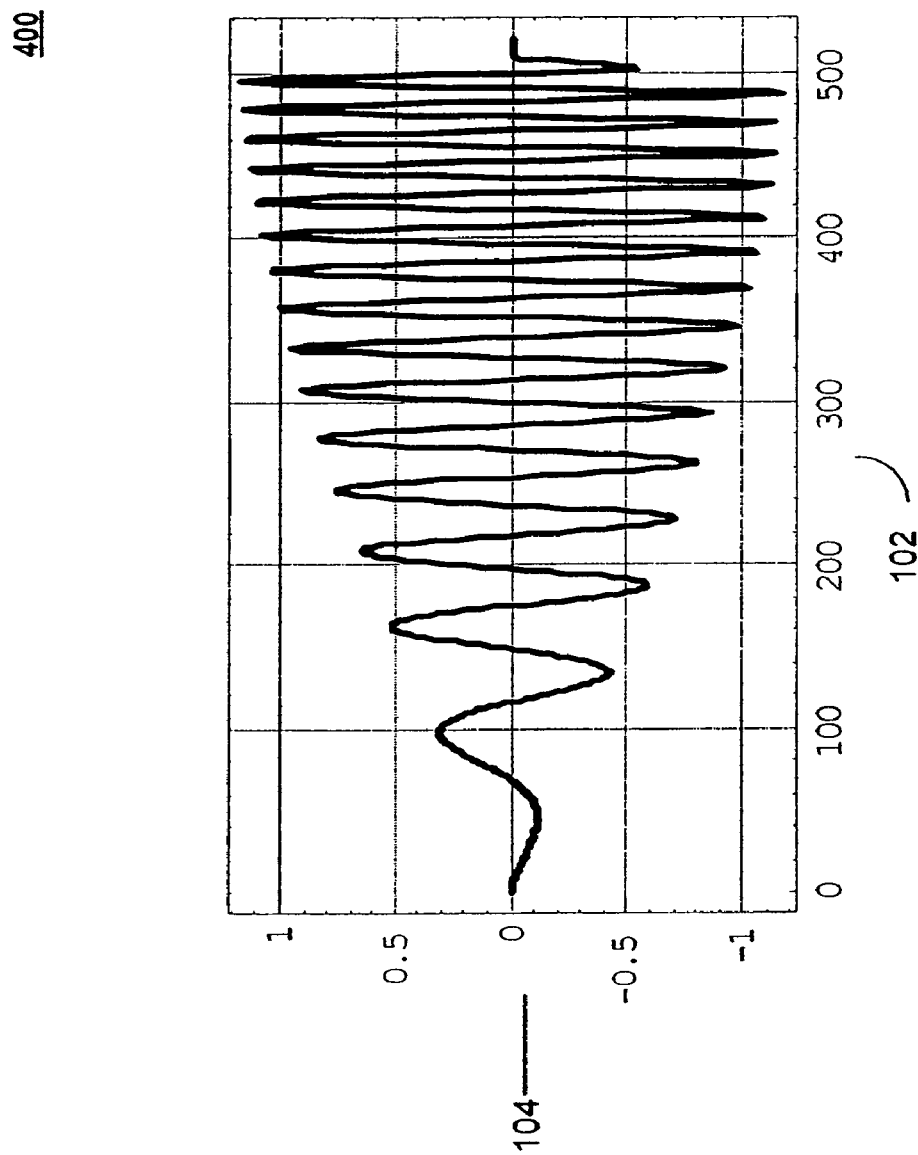
FIG. 4 illustrates an exemplary synthesis error signal produced by using the a known method with a multi-sample "impulse" input to a finite impulse response filter.

FIG. 4 illustrates the exemplary synthesis error signal 400 produced by using the Cooley method with the foregoing 10-sample "impulse" input to the FIR filter. In the illustrated embodiment, synthesis error 400 is computed as a point-by-point subtraction of the desired waveform 100 from the synthesized waveform 200. As shown, the error may increase sharply as the chirp frequency increases, due to the de-correlation in phase between the desired and synthesized pulses.

Figure 5:
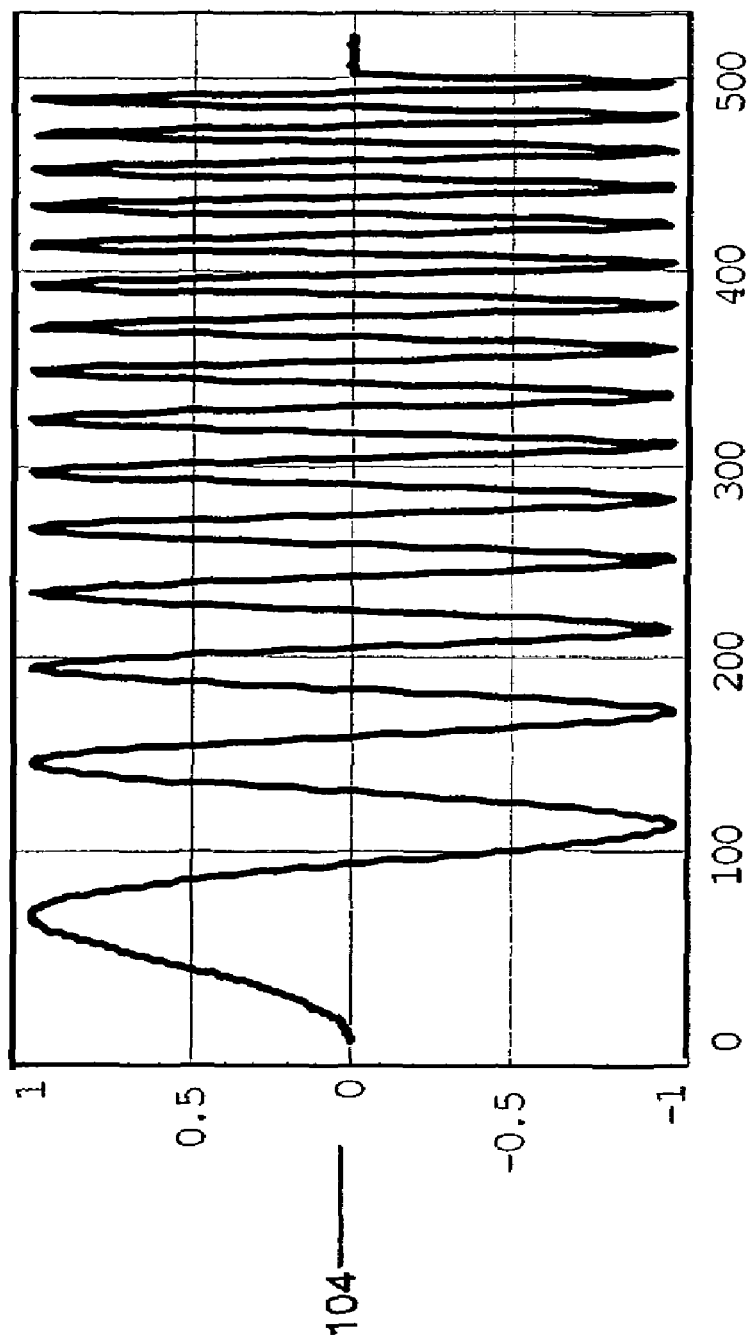
FIG. 5 illustrates an exemplary synthesized pulse waveform in accordance with certain embodiments.

The following embodiments and corresponding figures illustrate a number of advantages over known methods and corresponding systems. Beginning with FIG. 5, the figure illustrates an exemplary synthesized pulse waveform 400. As illustrated, exemplary synthesized pulse waveform 400 is essentially, if not exactly, an exact replica of desired waveform 100 illustrated in FIG. 1. Waveform 500 of FIG. 5 is generated using the same 10-sample "impulse" input to the FIR filter that generated distorted waveform 200 of FIG. 2 according to certain present embodiments. In one or more embodiments, the difference between synthesized waveform 500 and synthesized waveform 200 resides at least in part due to differences between the waveform generation filter coefficients of the FIR filter.

In certain implementations of U.S. Pat. No. 6,150,976, Cooley does not provide means to calculate the filter coefficients that would produce an exact replica of the desired waveform for a specific extended-duration stimulus. The teaching therefore made an approximation, using the respective filter coefficients, for a single-sample impulse stimulus (i.e., samples of the desired waveform), and then amplitude weighted the coefficients to reduce the amplitude roll-off evident in waveform 200 of FIG. 2. In accordance with the present embodiments, the filter coefficients required to produce the desired waveform from a specific, extended-duration stimulus are calculated. In certain embodiments, these coefficients are not the same as the samples of the desired waveform used in the aforementioned Cooley implementation.

In the exemplary embodiments illustrated in FIG. 6A, a desired waveform 600 is illustrated in accordance with the one or more embodiments. In the exemplary embodiments illustrated in FIG. 6B, a synthesized waveform 610 is illustrated in accordance with the same embodiments. Similarly to the embodiment of FIG. 3B, the input to the FIR filter used in the synthesis process comprises a 10-sample "impulse." However, in these embodiments, unlike the embodiment of FIG. 3B, there is little, no or negligible phase error, amplitude error, and/or stretching of the pulse. In certain embodiments, synthesized pulse 610 of FIG. 6B is essentially an exact match to the desired pulse 600 shown in FIG. 6A.

Figure 7A:
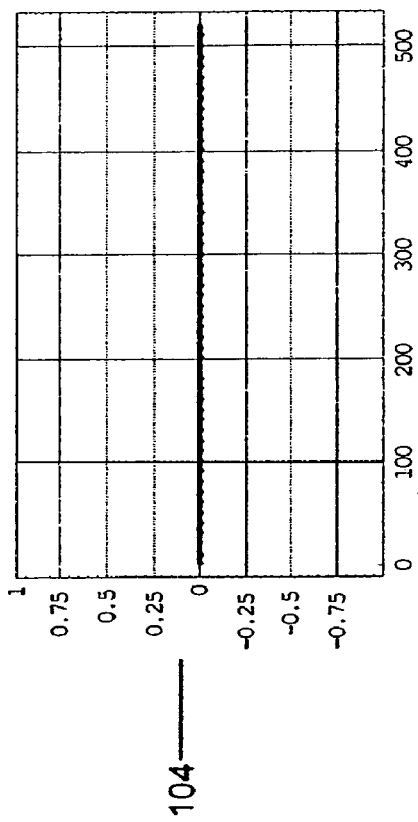
FIG. 7A illustrates a synthesis error produced by embodiments producing the synthesized waveform of FIG. 6B.
Figure 7B:
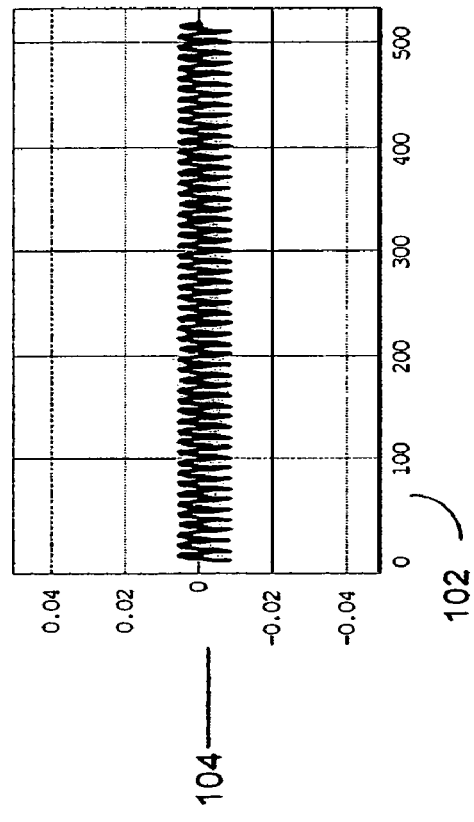
FIG. 7B illustrates the foregoing synthesis error with a greater degree of precision.

The exemplary embodiment illustrated in FIGS. 7A and 7B show the synthesis error produced by the embodiments producing the synthesized waveform 610 of FIG. 6B, where a 10-sample "impulse" signal is provided as input to the FIR filter. The error is computed as a point-by-point subtraction of the desired waveform 600 from the synthesized waveform 610. In contrast to error waveform 400 of FIG. 4, however, the error has been reduced to a negligible level. For the particular example illustrated, root mean squared (RMS) error is 0.0043, or −44 dB, with respect to the desired waveform signal 600. FIGS. 7A and 7B respectively show the same results, except that the ordinate 104 of synthesis error waveform 710 shows greater precision as compared to the ordinate 104 of synthesis error waveform 700.

Figure 8:
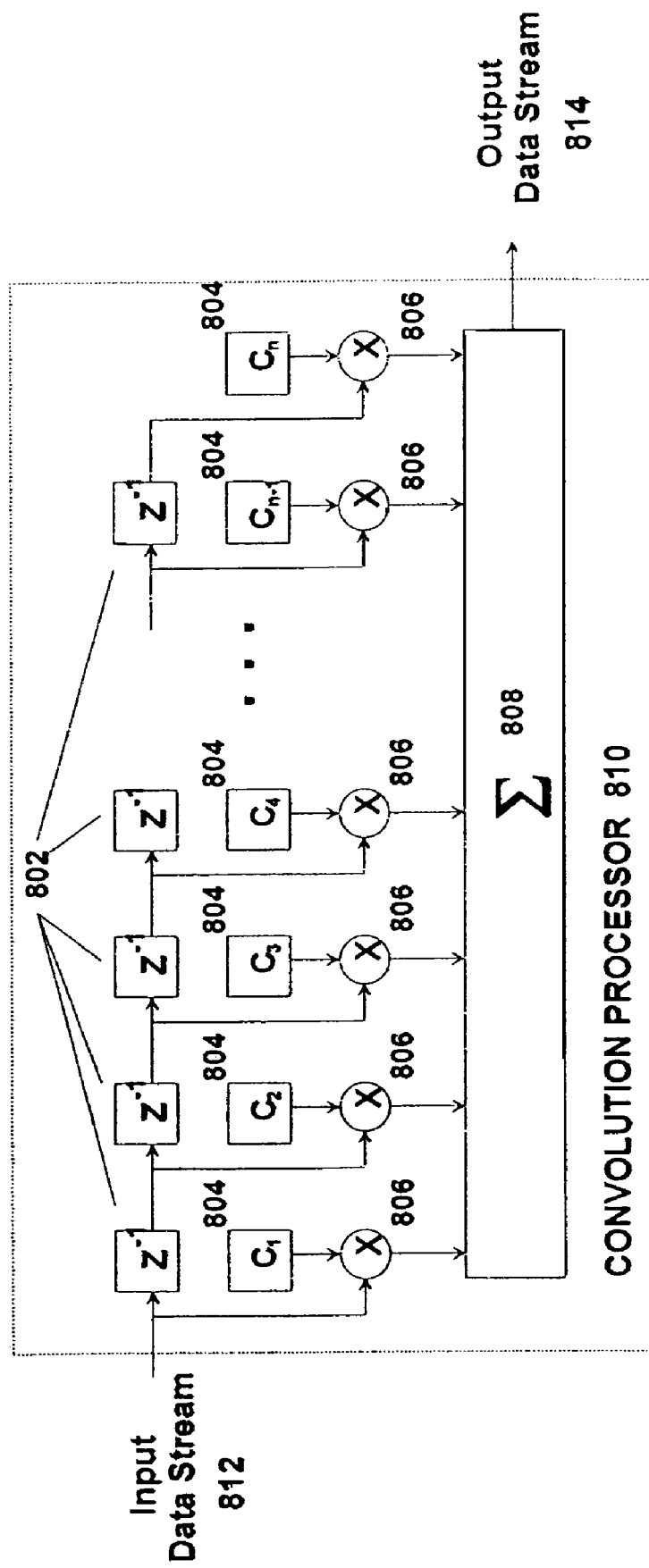
FIG. 8 illustrates the structure of an exemplary convolution processor in accordance with certain embodiments.

FIG. 8 illustrates the structure of an exemplary convolution processor 810 in accordance with the present embodiments. In an exemplary embodiment, exemplary convolution processor 810 may be a finite impulse response (FIR) filter. In respective embodiments, for example, structure 810 may be a FIR filter chip or a logic block internal to a field programmable gate array (FPGA) device, to name a few implementations thereof. Convolution processor 810 may operate by convolving exemplary input data stream 812 with a set of filter coefficients 804 to form an output data stream 814. The convolution process may be implemented by delaying the input through successive delay elements, such as taps 802 of one or more shift registers, and then multiplying via multipliers (or mixers) 806, each tap 802 with an applicable coefficient 804, and summing up the results of all the foregoing coefficient multiplications in summer 808, to form, for example, an output data stream 814.

Figure 9:
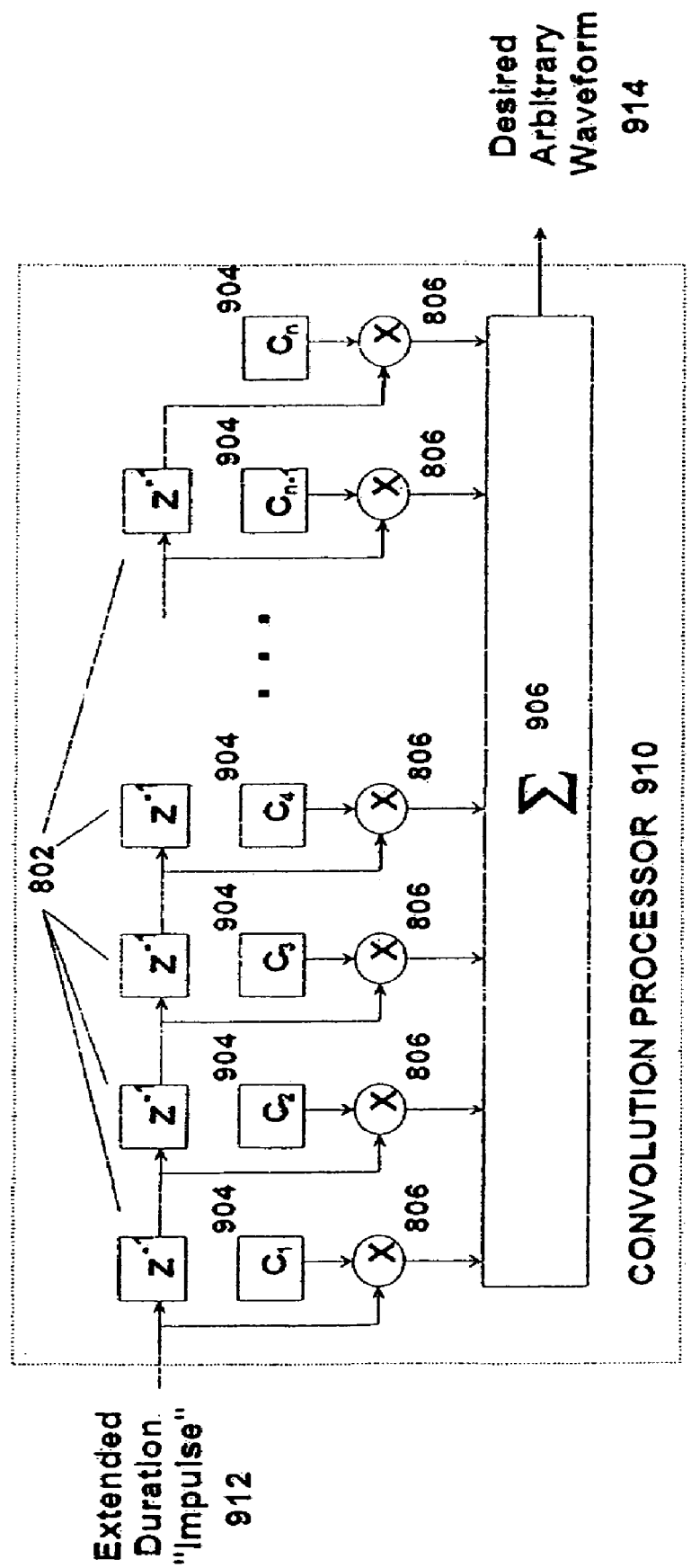
FIG. 9 illustrates the structure of an exemplary convolution processor in accordance with certain other embodiments, including the use thereof as an arbitrary waveform generator.

FIG. 9 illustrates the structure of the exemplary convolution processor 910 as used with one or more present embodiments, such as the use thereof as an arbitrary waveform generator. In these embodiments, the input data stream comprises an extended duration "impulse" waveform signal 912 that, when convolved against the filter coefficients 904, produces a synthesized waveform 914. In certain embodiments, the synthesized waveform 914 has little, no or negligible phase error in relation to a desired arbitrary waveform. In one or more embodiments, synthesized waveform 914 comprises an exact or nearly an exact match to the desired arbitrary waveform.

In one or more embodiments, the coefficients 904 are the impulse response of the convolution processor 910. In order to use the convolution processor 910 as an arbitrary waveform 914 generator with an extended-duration "impulse" 912 as the stimulus, however, the required coefficients 912 may not be equal to the desired arbitrary waveform, as was assumed by the embodiments of FIG. 8. Instead, in these embodiments, the coefficients 904 may be computed so as to produce the desired response 914 under the specific multi-sample stimulus 912. The following embodiments disclose the method of computing the required coefficients.

Figures 10, 11:
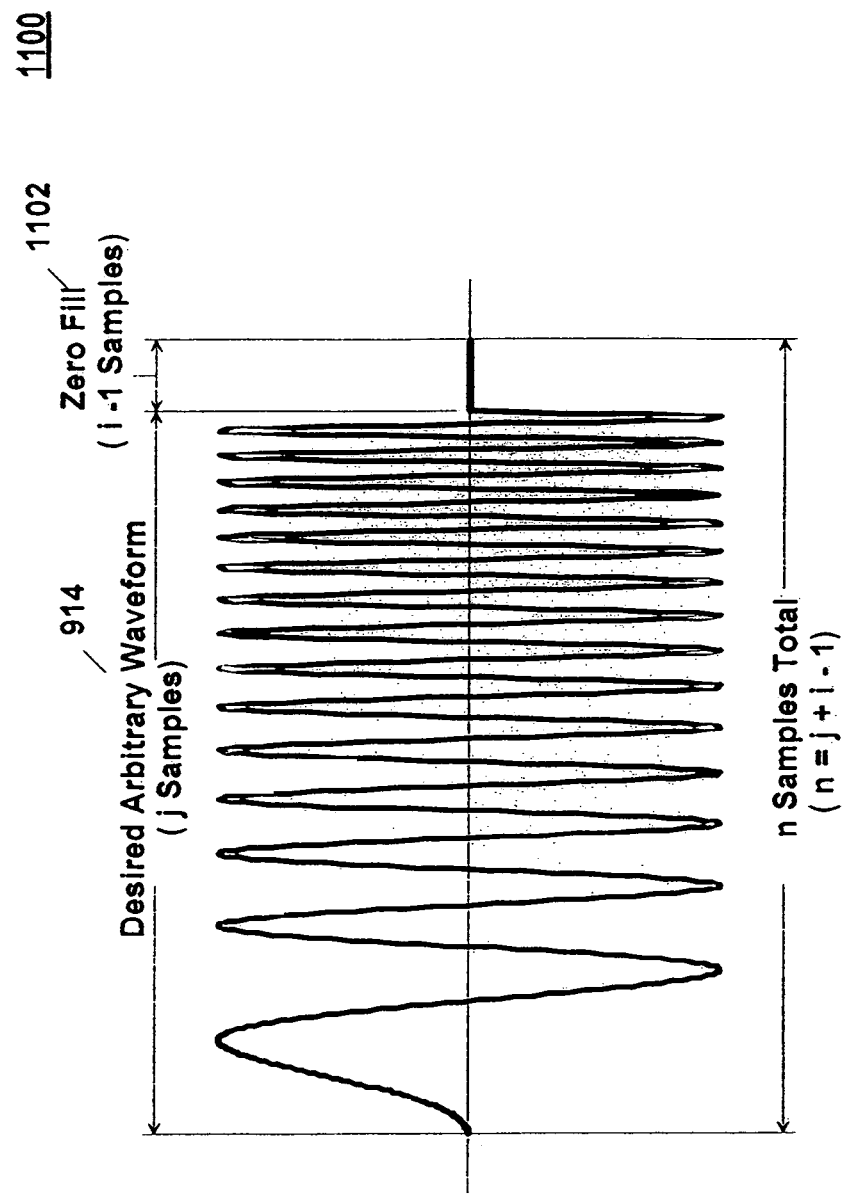
FIG. 10 illustrates an exemplary extended-duration "impulse" that serves as stimulus for an arbitrary waveform generator.
FIG. 11 illustrates an exemplary extrapolated version of desired arbitrary waveform in accordance with the present embodiments.

FIG. 10 illustrates an exemplary extended-duration "impulse" 912, that serves as stimulus for the arbitrary waveform 914 generator 910. In the illustrated embodiment, the foregoing is a 1 dimensional array of numbers, of arbitrary content and length, that contains i samples, where i may be an integer. In an embodiment, if the extended duration "impulse" 912 is un-modulated, it may consist of multiple samples of the integer 1. In another embodiment, however, the foregoing may be a modulated carrier sequence, such as (1, 0, −1, 0, 1, 0, −1, 0), or (0.707, 1, 0.707, 0, −0.707, −1, −0.707, 0), for example, or any arbitrary sequence of numbers, as design considerations may dictate.

FIG. 11 illustrates an exemplary extrapolated version of desired arbitrary waveform 1100 in accordance with the present embodiments. FIG. 12 illustrates an exemplary waveform data matrix (WFDM) 1200 derived from the desired arbitrary waveform 1100 of FIG. 11. In an embodiment, WFDM 1200 is a discrete sampled version waveform 1100.

Together, illustrative embodiments FIGS. 11 and 12 illustrate the derivation and composition of WFDM 1200 in accordance with the present embodiments. In the exemplary embodiment, WFDM 1200 is a resultant one dimensional array to be produced by convolving exemplary extended-duration "impulse" 912 with exemplary filter coefficients 904 of exemplary convolution processor 910.

In the shown embodiment, WFDM 1200 contains two components, which in embodiments may be based on waveform sampling. Referring to the extrapolated version of desired arbitrary waveform 1100 of FIG. 11, a number of, or in one embodiment the majority of, the data consists of j samples that define the desired arbitrary waveform 914 to be produced by exemplary convolution processor 910, in response to the extended-duration "impulse" 912.

Secondly, in the illustrated embodiment of FIG. 11, appended onto the end of the desired arbitrary waveform 914 are a number of zero fill samples 1102, namely in the illustrated embodiment i−1 zero fill samples, where i is the length of the extended-duration "impulse" 912. In one embodiment, the zeros 1102 are important, as they serve as a computational constraint to force the generated arbitrary waveform 914 back to zero, thereby eliminating the pulse-stretching distortion of other implementations, for example as illustrated in the embodiment of FIG. 3B. In the illustrated embodiment, the total number of samples, n, in WFDM 1200 is the sum of the j waveform 914 samples and the i−1 zero fill samples 1102, such that n=j+i−1.

FIG. 13 illustrates the composition of an exemplary filter coefficient matrix (FCM) 1300 in accordance with the present embodiments. In this exemplary embodiment, FCM 1300 is a 1×j linear array of coefficients that will produce exemplary j-sample desired arbitrary waveform 914 when exemplary convolution processor 910 is stimulated with exemplary i-sample extended duration "impulse" 912. In this exemplary embodiment, the number of coefficients, j, is at least as large as the sample length of non-zero content in exemplary desired arbitrary waveform 914, as illustrated in the embodiment of FIG. 11, but may be larger, at the expense of a loss of hardware efficiency. It should be noted that while in the embodiment illustrated in FIG. 9, there are n coefficients $C_1, C_2 \ldots C_n$, the subscript n may be replaced with the subscript j, in order to place the FIG. 9 embodiment in accord with the presently described embodiments.

In an exemplary embodiment, initially the coefficients in FCM 1300 are unknown variables. The coefficients are thereafter computed in accordance with the below described methods and corresponding systems.

Figure 14:
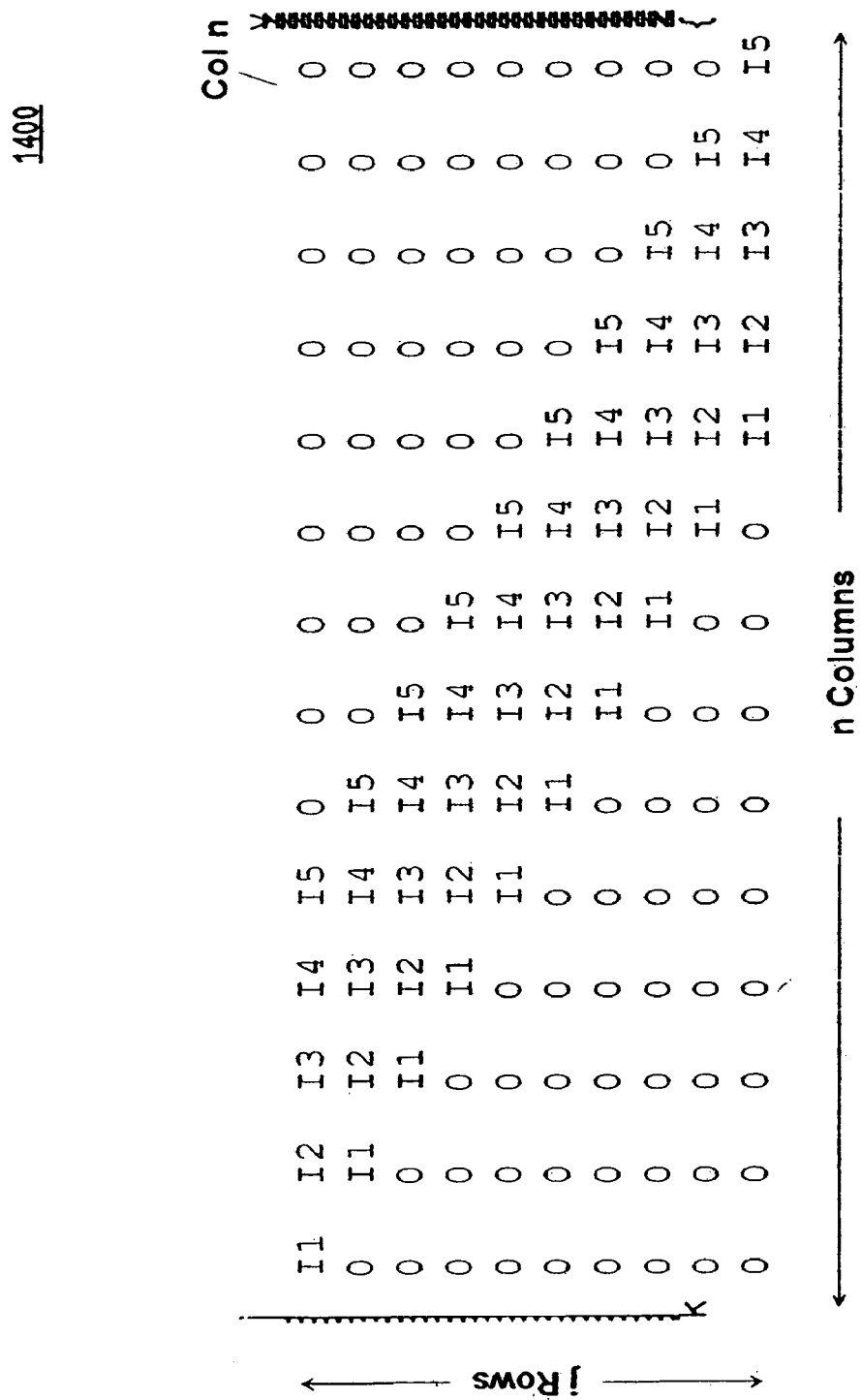
FIG. 14 illustrates an exemplary composition of a convolution state matrix in accordance with the present embodiments.

FIG. 14 illustrates an exemplary composition of a convolution state matrix (CSM) 1400 in accordance with the present embodiments. In the illustrated exemplary embodiment, CSM 1400 is a j×n matrix that represents the state of exemplary convolution processor 910 at each respective instant in time, as the extended duration "impulse" 912 propagates through the convolution processor 910.

In this exemplary embodiment, CSM 1400 has j rows, each row respectively representing a filter tap 802. In this exemplary embodiment, CMS also n columns, which column respectively representing the state of the convolution processor 910 at a given increment of time.

For example, at a first time increment designated time 1 (represented by column 1), the first value of the extended duration "impulse" waveform 912 is in column 1, row 1. All other row entries for Column 1 are zero.

Next, at a second time increment designated time 2 (represented by column 2), the first value of the extended duration "impulse" waveform 912 is in column 2, row 2. Row 1 of column 2 then holds the second value of the extended duration "impulse" waveform 912, and all other row entries are zero.

Next, at a third time increment designated time 3 (represented by column 3), the first value of the extended duration "impulse" waveform 912 is in column 3, row 3. Row 2 of column 3 holds the second value of the impulse, whereas row 1 holds the third value, and all other row entries are zero.

In the illustrated embodiment, CSM 1400 is populated in the foregoing manner, so that each column represents the location of the extended duration "impulse" waveform 912 in the convolution processor 910 at a given time. As time progresses, meaning as the columns progressively move to the right, the extended duration "impulse" waveform 912 moves down the column, meaning to higher row numbers, progressing down through the column in exactly the same way that the "impulse" waveform 912 propagates through the filter taps 802. Thus, in this embodiment CSM 1400 contains all time states of the filter, under stimulus from extended duration "impulse" waveform 912.

By defining CSM 1400 as shown in the FIG. 14 embodiment, the delay-multiply-add operation of convolution processor 910, shown as elements 802, 806, 906, may be represented by the following matrix dot product equation in accordance with principles of linear algebra:

$$WFDM = FCM \cdot CSM \quad \text{(Eqn 1)}$$

In this embodiment, exemplary WFDM 1200 is known, and is constructed from the desired arbitrary waveform 914 and zero fill 1102 as respectively described with respect to the embodiments of FIGS. 11 and 12. In this embodiment, exemplary CSM 1400 is known, and is constructed from the extended duration "impulse" waveform 912 as illustrated in the embodiment of FIG. 14. Accordingly, in this embodiment FCM 1300 contains the unknown coefficients $C_1, C_2 \ldots C_n$, and is determined by solving the foregoing Equation 1. The solution for Equation 1 may be derived, for example, in accordance with the below described embodiment, as follows:

$$FCM = WFDM \cdot \text{Transpose}[CSM] \cdot \text{Inverse}[CSM \cdot \text{Transpose}[CSM]] \quad \text{(Eqn 2)}$$

Accordingly, in this embodiment, the coefficients $C_1, C_2 \ldots C_n$ required to produce exemplary desired arbitrary waveform 914 from exemplary convolution processor 910 using exemplary extended duration "impulse" waveform 912 are the contents of FCM 1300, as for example computed in accordance with the foregoing Equation 2.

Exemplary Embodiment for Linear Algebraic Derivation of Filter Coefficient Matrix By way of clarification and not limitation, the following description provides an exemplary derivation of coefficients $C_1, C_2 \ldots C_n$ of exemplary convolution processor 910 of the embodiment of FIG. 9, described as a j×1 FCM matrix 1300 in accordance with the embodiment of FIG. 14. Accordingly, the foregoing indices j and n are the same for the purposes of the aforementioned comparison.

$WFDM = FCM \cdot CSM$ (This is the basic Matrix Equation)      Step 0

$WFDM \cdot \text{Transpose}[CSM] = FCM \cdot CSM \cdot \text{Transpose}[CSM]$      Step 1

Because CSM is a non-square matrix, it cannot be directly inverted, but it must be inverted in order to solve for the FCM. The solution to this dilemma is a matrix algebra technique known as a psuedo-inverse. The CSM on the right side of the equation is post-multiplied by its own transpose, which produces a square matrix as a result. The same operation is applied to the left side of the equation, to keep the equation in balance.

$WFDM \cdot \text{Transpose}[CSM] \cdot \text{Inverse}[CSM \cdot \text{Transpose}[CSM]] = FCM \cdot CSM19 \text{ Transpose}[CSM] \cdot \text{Inverse}[CSM \cdot \text{Transpose}[CSM]]$      Step 2

Here, the now-square matrix represented by the term "CSM·Transpose CSM" on the right side of the equation can be post-multiplied by its own inverse to drive it to Identity. The same operation is applied to the left side of the equation, to keep the equation in balance. The post-multiplication term "CSM·Transpose[CSM]·Inverse[CSM·Transpose[CSM]]"

on the right side of the equation is equal to Identity (the matrix equivalent of unity) and thus disappears, leaving the FCM term isolated.

$$FCM = WFDM \cdot \text{Transpose}[CSM] \cdot \text{Inverse}[CSM \cdot \text{Transpose}[CSM]] \quad \text{Step 3}$$

Once the FCM term is isolated, it is simply a matter of re-ordering the equation to get an explicit solution to the coefficient values in the FCM.

Exemplary Embodiment of Certain Advantages Provided

In exemplary embodiments, the method and corresponding system described above provide a number of advantages. Beginning with the advantage of accuracy, an exact or nearly exact replica of the desired waveform may be obtained, in amplitude, time, and phase, when the stimulus "impulse" has a longer duration than a single sample. This was not possible with prior art implementations In addition, the desired waveform may be generated by a convolution processor that is configured as a waveform generation filter. The filter may be stimulated by an extended-duration "impulse", and responds by producing an exact replica of the desired waveform. Multiple, time-overlapping copies of the desired waveform can be generated by stimulating the waveform generation filter with multiple, extended-duration "impulses" that are closely spaced in time.

Also, the ability to accommodate extended duration stimuli is provided. An exact replica of the desired waveform may be obtained from a stimulus "impulse" that is multiple samples in duration. This eliminates any compromise to waveform accuracy as a result of system considerations that require the stimulus to be more than a single sample in duration.

Exemplary Computer System Embodiment

Figure 15:
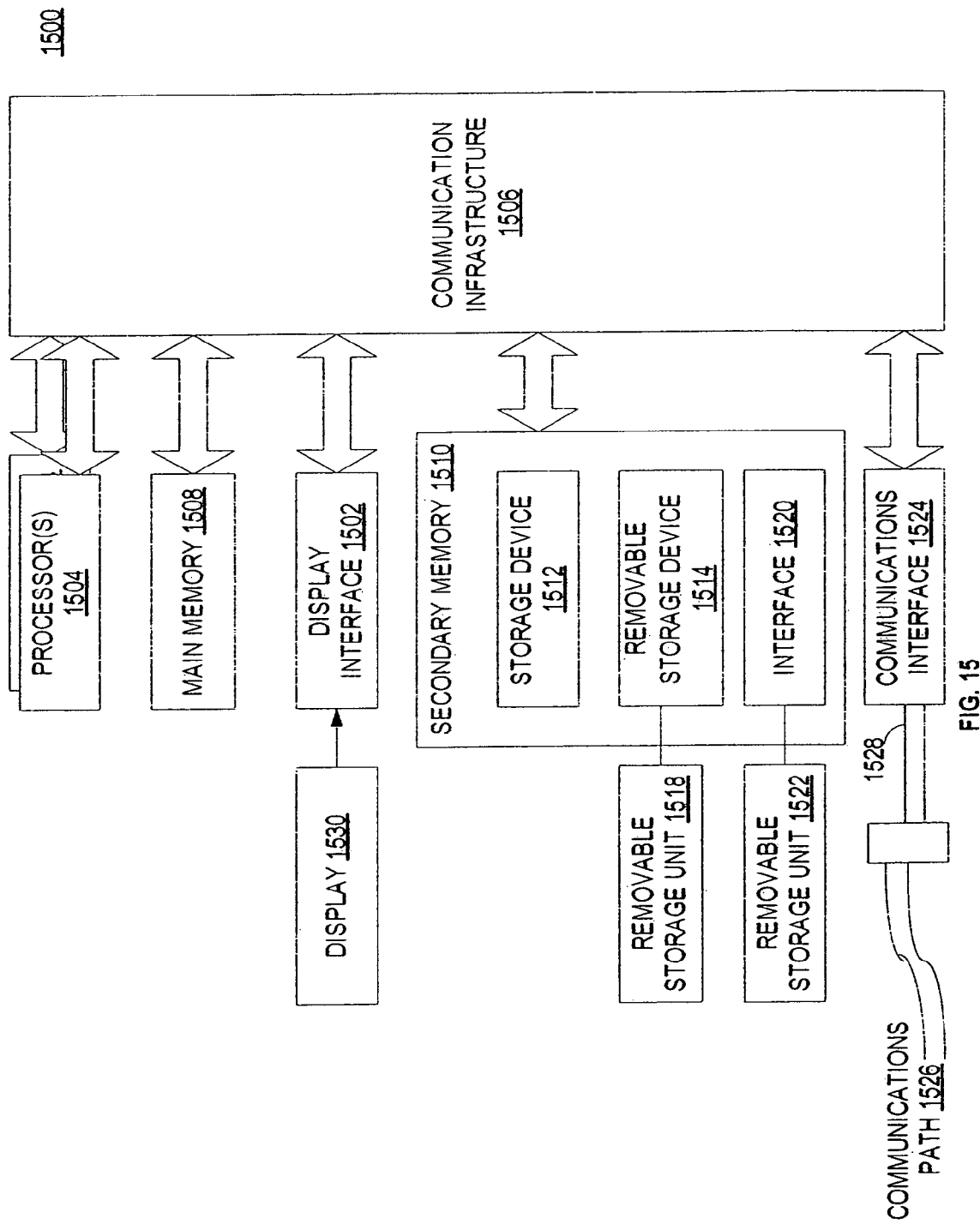
FIG. 15 illustrates an exemplary embodiment of a computer system that may be used in association with, in connection with, and/or in place of finite impulse response filters in accordance with the present embodiments.

FIG. 15 depicts an exemplary embodiment of a computer system 1500 that may be used in association with, in connection with, and/or in place of, but not limited to, the foregoing FIR filters, processors and/or computer systems associated therewith, according to exemplary embodiments of the present invention.

The present embodiments (or any part(s) or function(s) thereof) may be implemented using hardware, software, firmware, or a combination thereof and may be implemented in one or more computer systems or other processing systems. In fact, in one exemplary embodiment, the invention may be directed toward one or more computer systems capable of carrying out the functionality described herein. An example of a computer system 1500 is shown in FIG. 15, depicting an exemplary embodiment of a block diagram of an exemplary computer system useful for implementing the present invention. Specifically, FIG. 15 illustrates an example computer 1500, which in an exemplary embodiment may be, e.g., (but not limited to) a personal computer (PC) system running an operating system such as, e.g., (but not limited to) WINDOWS MOBILE™ for POCKET PC, or MICROSOFT® WINDOWS® NT/98/2000/XP/CE/, etc. available from MICROSOFT® Corporation of Redmond, Wash., U.S.A., SOLARIS® from SUN® Microsystems of Santa Clara, Calif., U.S.A., OS/2 from IBM® Corporation of Armonk, N.Y., U.S.A., Mac/OS from APPLE® Corporation of Cupertino, Calif., U.S.A., etc., or any of various versions of UNIX® (a trademark of the Open Group of San Francisco, Calif., USA) including, e.g., LINUX®, HPUX®, IBM AIX®, and SCO/UNIX®, etc. However, the invention may not be limited to these platforms. Instead, the invention may be implemented on any appropriate computer system running any appropriate operating system. In one exemplary embodiment, the present invention may be implemented on a computer system operating as discussed herein. An exemplary computer system, computer 1500 is shown in FIG. 15. Other components of the invention, such as, e.g., (but not limited to) a computing device, a communications device, a telephone, a personal digital assistant (PDA), a personal computer (PC), a handheld PC, client workstations, thin clients, thick clients, proxy servers, network communication servers, remote access devices, client computers, server computers, routers, web servers, data, media, audio, video, telephony or streaming technology servers, etc., may also be implemented using a computer such as that shown in FIG. 15.

The computer system 1500 may include one or more processors, such as, e.g., but not limited to, processor(s) 1504. The processor(s) 1504 may be connected to a communication infrastructure 1506 (e.g., but not limited to, a communications bus, cross-over bar, or network, etc.). Various exemplary software embodiments may be described in terms of this exemplary computer system. After reading this description, it will become apparent to a person skilled in the relevant art(s) how to implement the invention using other computer systems and/or architectures.

Computer system 1500 may include a display interface 1502 that may forward, e.g., but not limited to, graphics, text, and other data, etc., from the communication infrastructure 1506 (or from a frame buffer, etc., not shown) for display on the display unit 1530.

The computer system 1500 may also include, e.g., but may not be limited to, a main memory 1508, random access memory (RAM), and a secondary memory 1510, etc. The secondary memory 1510 may include, for example, (but not limited to) a hard disk drive 1512 and/or a removable storage drive 1514, representing a floppy diskette drive, a magnetic tape drive, an optical disk drive, a compact disk drive CD-ROM, etc. The removable storage drive 1514 may, e.g., but not limited to, read from and/or write to a removable storage unit 1518 in a well known manner. Removable storage unit 1518, also called a program storage device or a computer program product, may represent, e.g., but not limited to, a floppy disk, magnetic tape, optical disk, compact disk, etc. which may be read from and written to by removable storage drive 1514. As will be appreciated, the removable storage unit 1518 may include a computer usable storage medium having stored therein computer software and/or data.

In alternative exemplary embodiments, secondary memory 1510 may include other similar devices for allowing computer programs or other instructions to be loaded into computer system 1500. Such devices may include, for example, a removable storage unit 1522 and an interface 1520. Examples of such may include a program cartridge and cartridge interface (such as, e.g., but not limited to, those found in video game devices), a removable memory chip (such as, e.g., but not limited to, an erasable programmable read only memory (EPROM), or programmable read only memory (PROM) and associated socket, and other removable storage units 1522 and interfaces 1520, which may allow software and data to be transferred from the removable storage unit 1522 to computer system 1500.

Computer 1500 may also include an input device such as, e.g., (but not limited to) a mouse or other pointing device such as a digitizer, and a keyboard or other data entry device (none of which are labeled).

Computer 1500 may also include output devices, such as, e.g., (but not limited to) display 1530, and display interface

1502. Computer 1500 may include input/output (I/O) devices such as, e.g., (but not limited to) communications interface 1524, cable 1528 and communications path 1526, etc. These devices may include, e.g., but not limited to, a network interface card, and modems (neither are labeled). Communications interface 1524 may allow software and data to be transferred between computer system 1500 and external devices. Examples of communications interface 1524 may include, e.g., but may not be limited to, a modem, a network interface (such as, e.g., an Ethernet card), a communications port, a Personal Computer Memory Card International Association (PCMCIA) slot and card, etc. Software and data transferred via communications interface 1524 may be in the form of signals 1528 which may be electronic, electromagnetic, optical or other signals capable of being received by communications interface 1524. These signals 1528 may be provided to communications interface 1524 via, e.g., but not limited to, a communications path 1526 (e.g., but not limited to, a channel). This channel 1526 may carry signals 1528, which may include, e.g., but not limited to, propagated signals, and may be implemented using, e.g., but not limited to, wire or cable, fiber optics, a telephone line, a cellular link, an radio frequency (RF) link and other communications channels, etc.

In this document, the terms "computer program medium" and "computer readable medium" may be used to generally refer to media such as, e.g., but not limited to removable storage drive 1514, a hard disk installed in hard disk drive 1512, and signals 1528, etc. These computer program products may provide software to computer system 1500. The invention may be directed to such computer program products.

References to "one embodiment," "an embodiment," "example embodiment," "various embodiments," etc., may indicate that the embodiment(s) of the invention so described may include a particular feature, structure, or characteristic, but not every embodiment necessarily includes the particular feature, structure, or characteristic. Further, repeated use of the phrase "in one embodiment," or "in an exemplary embodiment," do not necessarily refer to the same embodiment, although they may.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

In a similar manner, the term "processor" may refer to any device or portion of a device that processes electronic data from registers and/or memory to transform that electronic data into other electronic data that may be stored in registers and/or memory. A "computing platform" may comprise one or more processors.

Embodiments of the present invention may include apparatuses for performing the operations herein. An apparatus may be specially constructed for the desired purposes, or it may comprise a general purpose device selectively activated or reconfigured by a program stored in the device.

Embodiments of the invention may be implemented in one or a combination of hardware, firmware, and software. Embodiments of the invention may also be implemented as instructions stored on a machine-readable medium, which may be read and executed by a computing platform to perform the operations described herein. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other form of propagated signals (e.g., carrier waves, infrared signals, digital signals, etc.), and others.

Computer programs (also called computer control logic), may include object oriented computer programs, and may be stored in main memory 1508 and/or the secondary memory 1510 and/or removable storage units 1514, also called computer program products. Such computer programs, when executed, may enable the computer system 1500 to perform the features of the present invention as discussed herein. In particular, the computer programs, when executed, may enable the processor 1504 to provide a method to resolve conflicts during data synchronization according to an exemplary embodiment of the present invention. Accordingly, such computer programs may represent controllers of the computer system 1500.

In another exemplary embodiment, the invention may be directed to a computer program product comprising a computer readable medium having control logic (computer software) stored therein. The control logic, when executed by the processor 1504, may cause the processor 1504 to perform the functions of the invention as described herein. In another exemplary embodiment where the invention may be implemented using software, the software may be stored in a computer program product and loaded into computer system 1500 using, e.g., but not limited to, removable storage drive 1514, hard drive 1512 or communications interface 1524, etc. The control logic (software), when executed by the processor 1504, may cause the processor 1504 to perform the functions of the invention as described herein. The computer software may run as a standalone software application program running atop an operating system, or may be integrated into the operating system.

In yet another embodiment, the invention may be implemented primarily in hardware using, for example, but not limited to, hardware components such as application specific integrated circuits (ASICs), or one or more state machines, etc. Implementation of the hardware state machine so as to perform the functions described herein will be apparent to persons skilled in the relevant art(s).

In another exemplary embodiment, the invention may be implemented primarily in firmware.

In yet another exemplary embodiment, the invention may be implemented using a combination of any of, e.g., but not limited to, hardware, firmware, and software, etc.

Exemplary embodiments of the invention may also be implemented as instructions stored on a machine-readable medium, which may be read and executed by a computing platform to perform the operations described herein. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other form of propagated signals (e.g., carrier waves, infrared signals, digital signals, etc.), and others.

The exemplary embodiment of the present invention makes reference to wired, or wireless networks. Wired networks include any of a wide variety of well known means for coupling voice and data communications devices together. A brief discussion of various exemplary wireless network technologies that may be used to implement the embodiments of the present invention now are discussed. The examples are non-limited. Exemplary wireless network types may include, e.g., but not limited to, code division multiple access (CDMA), spread spectrum wireless, orthogonal frequency division multiplexing (OFDM), 1G, 2G, 3G wireless, Bluetooth, Infrared Data Association (IrDA), shared wireless access protocol (SWAP), "wireless fidelity" (Wi-Fi), WIMAX, and other IEEE standard 802.11-compliant wireless local area network (LAN), 802.16-compliant wide area network (WAN), and ultrawideband (UWB), etc.

Bluetooth is an emerging wireless technology promising to unify several wireless technologies for use in low power radio frequency (RF) networks.

IrDA is a standard method for devices to communicate using infrared light pulses, as promulgated by the Infrared Data Association from which the standard gets its name. Since IrDA devices use infrared light, they may depend on being in line of sight with each other.

The exemplary embodiments of the present invention may make reference to WLANs. Examples of a WLAN may include a shared wireless access protocol (SWAP) developed by Home radio frequency (HomeRF), and wireless fidelity (Wi-Fi), a derivative of IEEE 802.11, advocated by the wireless Ethernet compatibility alliance (WECA). The IEEE 802.11 wireless LAN standard refers to various technologies that adhere to one or more of various wireless LAN standards. An IEEE 802.11 compliant wireless LAN may comply with any of one or more of the various IEEE 802.11 wireless LAN standards including, e.g., but not limited to, wireless LANs compliant with IEEE std. 802.11a, b, d or g, such as, e.g., but not limited to, IEEE std. 802.11 a, b, d and g, (including, e.g., but not limited to IEEE 802.11g-2003, etc.), etc.

CONCLUSION

Although the invention is described in terms of this example environment, it is important to note that description in these terms is provided for purposes of illustration only. It is not intended that the invention be limited to this example environment or to the precise inter-operations between the above-noted entities and devices. In fact, after reading the following description, it will become apparent to a person skilled in the relevant art how to implement the invention in alternative environments.

What is claimed is:

1. A method for generating a synthesized waveform from a desired arbitrary waveform via a convolution processor, comprising:
    providing a data stream input signal to the convolution processor comprising an extended duration impulse signal;
    computing one or more filter coefficients of the convolution processor; and
    generating the synthesized waveform substantially similar to the desired arbitrary waveform using the filter coefficients.

2. A method according to claim 1, wherein the convolution processor comprises a finite impulse response (FIR) filter.

3. A method according to claim 1, wherein the extended duration impulse signal comprises i impulse signals, where i is an integer.

4. A method according to claim 3, wherein the convolution processor performs a convolution upon the extended duration impulse signal, wherein:
    (a) the extended duration impulse signal is successively delayed via one or more taps and the output of each said tap is multiplied by a said filter coefficient corresponding to a delay thereof; and
    (b) the summation of said products of tap outputs and filter coefficients comprises said desired arbitrary waveform.

5. A method according to claim 4, wherein the convolution processor comprises j of the taps and j of the filter coefficients, where j is an integer.

6. A method according to claim 5, wherein the desired arbitrary waveform is sampled j times.

7. A method according to claim 6, wherein the j samples of the desired arbitrary waveform are supplemented by i−1 samples equaling zero to generate an n×1 waveform data matrix (WFDM), where n=j+i−1.

8. A method according to claim 7, wherein the state of the convolution processor is determined as the extended duration impulse signal is transmitted to the convolution processor at successive increments of time.

9. A method according to claim 8, wherein the state of the convolution processor is stored in a convolution state matrix (CSM) having n columns and j rows, each column representing a state of the convolution processor at a said increment of time, and each row representing a delay provided by a said tap.

10. A method according to claim 9, wherein the filter coefficients are derived from the waveform data matrix and the convolution state matrix.

11. A method according to claim 10, wherein the filter coefficients are stored in a filter coefficient matrix (FCM) whose value equals $$\text{WFDM·Transpose}[\text{CSM}]\cdot\text{Inverse}[\text{CSM·Transpose}[\text{CSM}]].$$

12. A system for generating a synthesized waveform from a desired arbitrary waveform via a convolution processor, comprising:
    apparatus operable to provide a data stream input signal to the convolution processor comprising an extended duration impulse signal;
    apparatus operable to compute one or more filter coefficients of the convolution processor; and apparatus operable to generate the synthesized waveform substantially similar to the desired arbitrary waveform using the filter coefficients.

13. A system according to claim 12, wherein the convolution processor comprises a finite impulse response (FIR) filter.

14. A system according to claim 12, wherein the extended duration impulse signal comprises i impulse signals, where i is an integer.

15. A system according to claim 14, wherein the convolution processor performs a convolution upon the extended duration impulse signal, wherein:
   (a) the extended duration impulse signal is successively delayed via one or more taps and the output of each said tap is multiplied by a said filter coefficient corresponding to a delay thereof; and
   (b) the summation of said products of tap outputs and filter coefficients comprises said desired arbitrary waveform.

16. A system according to claim 15, wherein the convolution processor comprises j of the taps and j of the filter coefficients, where j is an integer.

17. A system according to claim 16, wherein the desired arbitrary waveform is sampled j times.

18. A system according to claim 17, wherein the j samples of the desired arbitrary waveform are supplemented by i−1 samples equaling zero to generate an n×1 waveform data matrix (WFDM), where n=j+i−1.

19. A system according to claim 18, wherein the state of the convolution processor is determined as the extended duration impulse signal is transmitted to the convolution processor at successive increments of time.

20. A system according to claim 19, wherein the state of the convolution processor is stored in a convolution state matrix (CSM) having n columns and j rows, each column representing a state of the convolution processor at a said increment of time, and each row representing a delay provided by a said tap.

21. A system according to claim 20, wherein the filter coefficients are derived from the waveform data matrix and the convolution state matrix.

22. A system according to claim 21, wherein the filter coefficients are stored in a filter coefficient matrix (FCM) whose value equals WFDM·Transpose[CSM]·Inverse[CSM·Transpose[CSM]].

23. A machine-readable medium that provides instructions, which when executed by a computing platform, causes said computing platform to perform operations for generating a synthesized waveform from a desired arbitrary waveform via a convolution processor, comprising:

providing a data stream input signal to the convolution processor comprising an extended duration impulse signal;

computing one or more filter coefficients of the convolution processor; and generating the synthesized waveform substantially similar to the desired arbitrary waveform using the filter coefficients.

* * * * *